United States Patent [19]

Pawlowski et al.

[11] Patent Number: 4,859,562
[45] Date of Patent: Aug. 22, 1989

[54] PHOTOSENSITIVE MIXTURE AND PHOTOSENSITIVE RECORDING MATERIAL PRODUCED THEREFROM WITH POLYMERIC COMPOUND WHICH IS REACTION PRODUCT OF UNSATURATED (THIO)PHOSPHINIC ACID ISO(THIO)CYANATE AND ACTIVE HYDROGEN CONTAINING COMPOUND

[75] Inventors: Georg Pawlowski, Wiesbaden; Hans-Jerg Kleiner, Kronberg; Thomas Gerdau, Eppstein, all of Fed. Rep. of Germany

[73] Assignee: Hoechst Aktiengesellschaft, Frankfurt am Main, Fed. Rep. of Germany

[21] Appl. No.: 47,142

[22] Filed: May 8, 1987

[30] Foreign Application Priority Data

May 9, 1986 [DE] Fed. Rep. of Germany ....... 3615612

[51] Int. Cl.$^4$ .......... G03C 1/60; G03C 1/68; G03C 1/71; G03C 1/70
[52] U.S. Cl. .................. 430/175; 430/176; 430/192; 430/196; 430/197; 430/270; 430/281; 430/284; 430/906; 430/908; 430/909; 430/910
[58] Field of Search .......... 430/175, 176, 197, 196, 430/192, 270, 281, 284, 287, 906, 908, 909, 910

[56] References Cited

U.S. PATENT DOCUMENTS

| | | | |
|---|---|---|---|
| 3,197,308 | 7/1965 | Stahlhofen | 96/33 |
| 3,453,237 | 7/1969 | Borden | 260/47 |
| 3,655,625 | 4/1972 | Thomas | 430/156 |
| 3,732,106 | 5/1973 | Steppan | 96/115 R |
| 3,767,409 | 10/1973 | Grisdale et al. | 430/196 |
| 3,867,147 | 2/1975 | Teuscher | 430/176 |
| 4,289,838 | 9/1981 | Rowe et al. | 430/906 |
| 4,316,949 | 2/1982 | Petrellis et al. | 430/160 |
| 4,387,151 | 6/1983 | Bosse et al. | 430/175 |
| 4,391,894 | 7/1983 | Shimazu et al. | 430/196 |
| 4,427,765 | 1/1984 | Mohr et al. | 430/160 |
| 4,458,007 | 7/1984 | Geissler et al. | 430/284 |
| 4,695,527 | 9/1987 | Geissler et al. | 430/256 |

FOREIGN PATENT DOCUMENTS 2095854 10/1982 United Kingdom ............... 430/175

OTHER PUBLICATIONS

Research Disclosure, "Phosphorous Containing Photocrosslinkable Polymers", Industrial Opportunities Ltd. GB; Jun. 1973, Band 177, Nr. 110, pp. 72–80.

Photopolymers: Principles, Processes & Materials, Regional Technical Conference, "Photocrosslinkable Polyphosphonates Having Unusual Resistance to Acids", Borden, Oct. 1973, pp. 10–19, Society of Plastic Engineers, Inc.

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

A photosensitive mixture that contains a photosensitive compound, for example, a photoinitiator or a diazo compound, and a reaction product of a polymer containing active hydrogen with an olefinically unsaturated compound represented by the formula

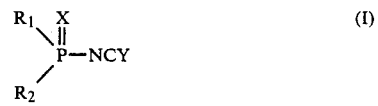

wherein
X and Y are the same or different and denote oxygen or sulfur,
$R_1$ is an olefinically unsaturated aliphatic radical containing 2 to 8 carbon atoms and
$R_2$ is a saturated aliphatic radical containing 1 to 8 carbon atoms or an aryl radical containing 6 to 10 carbon atoms, is suitable for producing photoresists and printing plates.

11 Claims, No Drawings

PHOTOSENSITIVE MIXTURE AND PHOTOSENSITIVE RECORDING MATERIAL PRODUCED THEREFROM WITH POLYMERIC COMPOUND WHICH IS REACTION PRODUCT OF UNSATURATED (THIO)PHOSPHINIC ACID ISO(THIO)CYANATE AND ACTIVE HYDROGEN CONTAINING COMPOUND

BACKGROUND OF THE INVENTION

The present invention relates to a photosensitive mixture that contains a polymeric compound with lateral olefinically unsaturated radicals and a photosensitive compound. The photosensitive mixture of the present invention is outstandingly suitable for producing printed circuits via resist technique and in particular, for producing lithographic printing plates used in offset printing.

Photosensitive mixtures are described in German Offenlegungsschrift No. 2,053,364 that contain reaction products of polymers containing hydroxyl or amino groups and unsaturated sulfonyl isocyanates and also an initiator and optionally further polymerizable compounds. Reaction products of the same type are described, in combination with diazonium salt polycondensates or low molecular azides, in German Offenlegungsschrift No. 3,036,077.

A disadvantage of these mixtures is, on the one hand, the complicated and expensive production of the necessary alkenylsulfonyl isocyanates. Moreover, the printing plates produced therefrom exhibit an inadequate ink receptivity, so that an unacceptably high output of waste paper is produced in the proofing process and after a prolonged stoppage. In particular, mixtures according to German Offenlegungsschrift No. 2,053,364, which contain exclusively a photoinitiator and the light-curable polymer described, have only a very low photosensitivity and a poor resistance to abrasion. Consequently, long-run lithographic printing plates cannot be produced with these materials.

From German Offenlegungsschrift No. 2,053,363 mixtures are known that contain, as binders, reaction products of polymers containing hydroxyl or amino groups and at least one saturated alkyl-, alkoxy-, aryl- or aryloxysulfonyl isocyanate. The binder is in this case processed in combination with diazonium salt condensation products or photopolymerizable mixtures to form photosensitive layers. The mixtures obtained in this process can, however, be developed under aqueous and alkaline conditions only if the binders used have high acid numbers, as a result of which the abrasion resistance and the printing properties of the cured layer are adversely influenced.

SUMMARY OF THE INVENTION

It is therefore an object of the present invention to provide a photosensitive mixture that displays the known advantages of the photopolymerizable compounds prepared from sulfonyl isocyanates but, in addition, yields photosensitive layers with better abrasion resistance after exposure and printing plates with better ink receptivity.

It is also an object of the present invention to provide a photosensitive mixture, useful in producing photoresists and printing plates, that can be produced from readily available starting materials.

It is a further object of the present invention to provide a photosensitive recording material displaying abrasion resistance, ink receptivity and other properties that are enhanced over known, comparable materials.

In accomplishing the foregoing objects, there has been provided, in accordance with one aspect of the present invention, a photosensitive mixture comprising (a) a polymeric compound having lateral olefinically unsaturated radicals and (b) a photosensitive compound, wherein the polymeric compound is a reaction product of (i) an olefinically unsaturated compound represented by the formula

wherein

X and Y are the same or different, and each is oxygen or sulfur, $R_1$ is an olefinically unsaturated aliphatic radical containing 2 to 8 carbon atoms and $R_2$ is a saturated aliphatic radical containing 1 to 8 carbon atoms or an aryl radical containing 6 to 10 carbon atoms, with (ii) a polymer containing active hydrogen.

In a preferred embodiment, substituent $R_1$ of formula (I) is an olefinically unsaturated aliphatic radical containing 2 to 4 carbon atoms.

There has also been provided, in accordance with another aspect of the present invention, a photosensitive recording material comprising a layer support and a photosensitive layer comprised of the above-described photosensitive mixture.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The unsaturated polymeric compounds contained in a mixture according to the present invention have lateral, olefinically unsaturated (thio)phosphinylurethane, (thio)phosphinylthiourethane, (thio)phosphinylurea or (thio)phosphinylthiourea functional groups. These compounds are produced by reacting olefinically unsaturated compounds of formula I with polymers containing active hydrogen, for example, with polymers containing hydroxyl or amino groups and the active hydrogen is supplied by hydroxyl or amino groups.

If $R_1$ is an aliphatic or cycloaliphatic radical, it generally contains one or two olefinic doublebonds. Examples are vinyl, propenyl, allyl, 1-buten-4-yl, 4-chlorobutadienyl, cyclohexen-1-yl, 3,5-dimethylcyclohexen-1-yl and 3-vinylhexyl radicals. Aliphatic radicals containing 2 to 6 carbon atoms, particularly 2 to 3 carbon atoms, are preferred. Preferred examples are vinyl, allyl, methallyl and crotyl radicals. Halogen atoms, preferably chlorine, are suitable as substituents.

$R_2$ can be an alkyl radical containing 1 to 4 carbon atoms, in particular 1 or 2 carbon atoms, or a substituted phenyl radical. Halogen atoms, in particular chlorine, alkyl radicals or alkoxy radicals containing 1 to 4 carbon atoms are suitable as substituents. The aromatic radicals $R_2$ can contain 1 to 3 substituents, preferably 1 or 2 substituents, or can be unsubstituted.

Preferred unsaturated (thio)phosphinic acid iso(thio)cyanates for the present invention include:
Allylmethylphosphinic acid isocyanate,
Allylmethylthiophosphinic acid isocyanate,
Allylmethylphosphinic acid isocyanate,
Allylmethylthiophosphinic acid isocyanate,
Allylmethylphosphinic acid isothiocyanate,
Allylmethylthiophosphinic acid isothiocyanate,
Crotylmethylphosphinic acid isocyanate,
β-Methallylmethylphosphinic acid isocyanate,
β-Methallylmethylphosphinic acid isothiocyanate,
Methylvinylphosphinic acid isocyanate,
Methylvinylthiophosphinic acid isocyanate,
Methylvinylphosphinic acid isothiocyanate,
Methylvinylthiophosphinic acid isothiocyanate,
Ethylvinylphosphinic acid isocyanate,
Butylvinylphosphinic acid isocyanate,
Phenylvinylphosphinic acid isocyanate,
Phenylvinylthiophosphinic acid isocyanate,
Phenylvinylphosphinic acid isothiocyanate, and
Phenylvinylthiophosphinic acid isothiocyanate.

The (thio)phosphinic acid derivatives mentioned above can be prepared from the corresponding (thio)phosphinic acid chlorides of the general formula

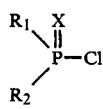  (II)

wherein $R_1$, $R_2$ and X have the meanings specified above, by reaction with inorganic cyanates or thiocyanates.

The preparation of these intermediate products is also described in the concurrently filed U.S. patent application Ser. No. 047,103.

The polymers that are capable of reacting with these compounds and that contain active hydrogen are preferably polymers having hydroxyl or amino groups. Among these are compounds that bear hydroxyl groups, which compounds are preferred to those containing amino groups, since the photosensitive polymers containing urethane groups have substantially better solubility in aqueous and alkaline developer solutions than do those that have urea groups. In addition, the reaction products containing urea groups are frequently more brittle and more difficult to process.

The good solubility of the polymers having (thio)urethane or (thio)urea groups in aqueous-alkaline solutions results from the acidic character of the hydrogen atoms bonded to the nitrogen as a consequence of activation by adjacent carbonyl or phosphinic acid groups.

For example, vinyl or allyl alcohol polymers can be used as starting polymers containing hydroxyl groups. Preferably, vinyl alcohol polymers are used, in particular partially acetalated or partially esterified polyvinyl alcohols. Among these polyvinyl alcohol polymers, polyvinylacetals are preferred, with polyvinylformals and polyvinylbutyrals having mean molecular weights between 5,000 and 200,000 or more, preferably of 10,000 to 100,000, and containing 5 to 30% by weight of vinyl alcohol units, being particularly preferred. For example, allyl alcohol copolymers can contain, as comonomer units, styrene or substituted styrene units, the allyl alcohol component preferably amounting to between 10 and 40% by weight. In addition, copolymers of vinyl or allyl alcohol with vinyl esters, vinyl ethers, acrylates, methacrylates or (meth)acrylonitrile can be used as starting materials.

Homopolymers or copolymers of hydroxyalkyl(meth)acrylates or glycerol mono(meth)acrylates with other known (meth)acrylates, such as methyl(meth)acrylate, hexyl(meth),acrylate, (meth)acrylonitrile and the like, can also be used with favorable results as starting polymers which contain hydroxyl groups, if they contain more than 10% by weight of hydroxyalkyl(meth)acrylate or glycerol mono(meth)acrylate units.

Epoxy resins, for example, condensation products of 2,2-bis(4-hydroxyphenyl)propane and epichlorohydrin, and reaction products of partially reacted glycidyl(meth)acrylates, can also be used with advantage in the present invention, provided these polymers have an adequate number of free reactive hydroxyl groups and have molecular weights between 2,000 and 200,000.

Cellulose ethers and cellulose esters are likewise suitable, provided they have unreacted hydroxyl groups. Particularly useful in this context are partial esters with low aliphatic carboxylic acids, such as cellulose acetate. Suitable cellulose ethers are, for example, mixed alkyl hydroxyalkyl ethers of the celluloses. Preferably between 0.3 and 2.3 free hydroxyl groups should be present per glucose unit.

The condensable polyesters which are useful in the present invention include those compounds that are not completely esterified and that contain hydroxyl groups resulting from branchings or terminal hydroxyl groups. For those compounds the degree of branching should not be too high.

Finally, compounds containing amino groups can also be used as starting polymers, in accordance with he present invention, for the reaction with olefinically unsaturated (thio)phosphinic acid isocyanates and isothiocyanates of formula I. The polymers resulting from such reactions are not preferred, however, by virtue of their frequently observable brittleness. In addition, they often cannot be developed rapidly enough with aqueous and alkaline developer solutions, and the polymers can adhere too strongly to the metallic substrate. Nevertheless, copolymers of N-vinyl-N-methylamine, and also of polyamides, such as polycaprolactam, and of polyurethanes, including reaction products of diisocyanates with dihydric or polyhydric alcohols, and of polyamideimides can be used to advantage in the present invention.

If a photosensitive mixture containing an unsaturated polymer in accordance with the present invention, is employed in the offset field, then reaction products with polyvinylacetals are especially preferred. Copolymers of hydroxyalkyl(meth)acrylate having low molecular weight are especially suitable when a mixture of the present invention is used in the resist technique.

The quantitative proportion of the unsaturated polymers in the mixture according to the invention is generally 20% to 95% by weight, preferably 40% to 90% by weight, based on the nonvolatile constituents in the mixture.

The production of the unsaturated polymers suitable for use in the present invention is not difficult, since the unsaturated (thio)phosphinic acid isocyanates and isothiocyanates of formula I react exceedingly easily with groupings that have active hydrogen atoms. It is possible from time to time, consequently, to dispense with an addition of catalysts or an increase in the reaction temperature.

In general, to produce the unsaturated polymers, 2% to 25% by weight of the polymer containing active hydrogen is dissolved in a suitable inert solvent such as dioxane, tetrahydrofuran, ethylene glycol dimethyl ether, ethylene glycol diacetate or butanone, and the corresponding isocyanate, preferably dissolved in the same solvent, is added dropwise at room temperature. Under these conditions a slight rise in temperature of the reaction mixture is typically observed.

If the isothiocyanates of formula I are reacted, it is expedient to add a catalyst, such as diazabicyclo[2.2.2]octane, to the mixture described above, and/or to heat the mixture.

0.4 to 1.4 mol of (thio)phosphinic acid isocyanate and 0.4 to 1.7 mol of (thio)phosphinic acid isothiocyanate are preferably added per mol of active hydrogen, since an excess of the formula I compounds is necessary for a quantitative reaction of all the reactive groups of the starting polymer.

The unsaturated polymers may be processed further in the reaction solution, optionally after destroying excess isocyanate or isothiocyanate by adding an alcohol like ethanol.

For characterization purposes or for special applications, the polymer can be isolated by adding it dropwise to 10 times the quantity of a nonsolvent, preferably slightly acidified water, under which circumstances it is provided as a colorless-to-slightly-yellowish, amorphous product which, in general, can readily be filtered. Before being used in the photosensitive mixture according to the present invention, the product should be adequately dried.

Numerous substances can be used as photoinitiators in photosensitive mixtures according to the present invention. Examples of suitable photoinitiators are benzoins, benzoin ethers, polynuclear quinones such as 2-ethylanthraquinone, acridine derivatives such as 9-phenylacridine and benzacridine, phenazine derivatives such as 9,10-dimethylbenz[o]phenazine, quinoxaline and quinoline derivatives such as 2,3-bis(4-methoxyphenyl)-quinoxaline or 2-styrylquinoline, quinazoline compounds and acylphosphine oxide compounds. Photoinitiators of this type are described in German patent Nos. 2,027,467 and 2,039,861, and in European patent application No. 11,786. Also suitable are hydrazones, mercapto compounds, pyrylium and thiopyrylium salts, synergistic mixtures with ketones or hydroxy ketones and dyestuff redox systems. Especially preferred are photoinitiators having trihalomethyl groups that can be split by light, in which connection mention should be made, in particular, of corresponding compounds from the triazine and thiazoline series. Such compounds are described in German Offenlegungsschriften Nos. 2,718,259, 3,333,450 and 3,337,024. A particularly preferred triazine photoinitiator is 2-(4'-methoxystyryl)-4,6-bistrichloromethyl-s-triazine.

The photoinitiators used in the present invention are generally added in quantitative proportions of 0.1% to 15% by weight, preferably 0.5% to 10% by weight, based on the nonvolatile constituents of the mixture.

The unsaturated polymers used according to the present invention have very high photosensitivities in combination with a suitable photoinitiator and, optionally, a polymerizable monomer, and provide adequate curing of the exposed layer regions. In combination with the most varied, negative-functioning photosensitive substances, such as diazonium salt polycondensates, azido derivatives and p-quinonediazides, they produce layers that can be developed readily and without scumming in aqueous and alkaline media and that are notable for maximum abrasion resistance and excellent thermal stability. The mixtures obtained in this way can therefore also be used in numerous applications, in which connection particular mention should again be made of the production of lithographic plates and photoresists.

It is surprising that it is possible, pursuant to the present invention, to combine unsaturated polymers, photoinitiators and other photosensitive substances in photosensitive mixtures without, for example, the storage capability of the mixtures being impaired appreciably as a result. In addition, the unsaturated polymers can be used in combination with other photosensitive substances as nonphotoactive binders, it being possible to dispense with the addition of a photoinitiator. Such photosensitive mixtures have the advantage that a thermal curing of the developed layer, if desirable, can be effected.

In this case it may be advantageous to add to the layer thermally activatable compounds, for example, epoxy compounds and N-methylolamides like hexamethylol and hexamethoxymethylmelamine, that are capable of crosslinking. Thermally activatable polymerization initiators, such as organic peroxides, are also suitable for this purpose. If, as described above, the unsaturated polymers are used as binders, they may be combined also with saturated polymers suitable for the same purpose.

Polymerizable compounds can likewise be used as additives in a mixture according to the present invention, in particular in the field of printed circuits.

Suitable polymerizable compounds are known from U.S. Pat. Nos. 2,760,683 and 3,060,023. Examples are esters of acrylic acid or methacrylic acid, such as diglycerol diacrylate, guaiacol glycerol ether acrylate, neopentylglycol diacrylate, 2,2-dimethylolbutan-3-ol diacrylate, pentaerythritol tri- and tetraacrylate, and also the corresponding methacrylates. Furthermore, acrylates or methacrylates that contain urethane groups are suitable, as are acrylates and methacrylates of polyesters that contain hydroxyl groups. Finally, prepolymers containing allyl or vinyl groups are also suitable, those monomers or oligomers being preferred that contain at least two polymerizable groups per molecule.

The polymerizable compounds can in general be present in a mixture of the present invention in a quantity of up to 50% by weight, preferably of 10% to 35% by weight, based on the nonvolatile constituents in the mixture. In such photopolymerizable mixtures, it is expedient to increase the initiator concentration, within the range specified above, in accordance with the unsaturated proportion of the photopolymerizable monomers or oligomers added.

Virtually all known, negatively-functioning photosensitive substances can be used in the present invention, provided they are compatible with the polymer matrix. For instance, diazonium salt polycondensation products, such as condensation products of condensable aromatic diazonium salts with aldehydes, are very well suited. Exemplary of such condensation products are the products of diphenylamine-4-diazonium salts with formaldehyde. Advantageously, cocondensation products are used that, in addition to the diazonium salt units, contain nonphotosensitive units derived from condensable compounds. Such condensation products are known from German Offenlegungsschriften Nos. 2,024,242, 2,024,243 and 2,024,244. Generally, all the diazonium salt condensates described in German Offenlegungsschrift No. 2,739,774 are suitable.

For certain applications, low- and higher molecular azido derivatives are especially suitable as photosensitive compounds, with low-molecular azido compounds containing at least two azido groups per molecule being preferred. Illustrative compounds of this type are 4,4'-diazidostilbenes, 4,4'-diazidobenzophenones, 4,4'-diazidobenzalacetophenones, 4,4'-diazidobenzalacetones and 4,4'-diazidobenzalcyclohexanones. The photosensitivity of such azido compounds may be reinforced by the optional use of suitable sensitizers, for example, 1,2-benzanthraquinone. Furthermore, those polyfunctional azides are also suitable that display an individual absorption so displaced by conjugation with doublebonds in the molecule that no additional sensitization is necessary during exposure. Additional suitable azido compounds are known from British published application No. 790,131, German patent No. 950,618 and U.S. Pat. No. 2,848,328.

Moreover, low-molecular diazo compounds, such as p-quinone diazides and p-iminoquinone diazides, can be used as photosensitive compounds in the present invention. Such mixtures are, however, not preferred because of their relatively low photosensitivity.

The quantity of photosensitive, cross-linkable compound contained in a photosensitive mixture of the present invention is generally between 5% and 60% by weight, preferably between 10% and 40% by weight, based on the nonvolatile constituents of the mixture.

The mixtures according to the present invention can be processed in a conventional manner, according to their application. For this purpose, the unsaturated reaction product is dissolved in a suitable solvent or solvent mixture, such as ethylene glycol monomethyl ether, ethylene glycol monoacetate, dioxane, tetrahydrofuran or butanone. A coating can then be obtained from the resulting solution, which is optionally mixed with a photoinitiator that is soluble in the mixture; optionally, the mixture can be sensitized by the addition of additional photosensitive substances, which are likewise taken into solution.

As a function of the nature of the photosensitive compound employed, furthermore, the following additives can be added to the photosensitive coating solution:

(a) For sensitizing with diazo compounds, for example, p-quinon diazides or diazonium salt condensates:
 a dyestuff for rendering the photosensitive layer visible on the support material; an acid, preferably phosphoric acid, for stabilizing the diazonium salt; and a contrast agent which produces an intensification of the color change in the layer on exposure, (b) For sensitization with azido compounds:
 a dyestuff that contributes to rendering the photosensitive layer visible and to increasing the sensitivity of the photo-crosslinking compound in the desired spectral range, and (c) For sensitizing with photopolymerizable substances:
 photoinitiators that initiate the polymerization step on exposure, and inhibitors that suppress any thermally initiated polymerization.

Other additives, such as plasticizers, pigments, further resin components, etc., can be added to a photosensitive mixture of the present invention if they prove suitable for the particular application. Such additives, their action and possibilities of use are known to those skilled in the art.

The solutions obtained as described above are filtered for the purpose of further processing, in order to remove any undissolved constituents, and are applied to a suitable support material in a known manner, for example, by knife-coating or spinning. The coating thus applied is then dried. Support materials that are suitable for the coating include, among others, aluminum which has been roughened up mechanically or electrochemically and optionally anodized and post-treated; aluminum clad foil or foil otherwise rendered hydrophilic; foil copper-coated in vacuum and multimetal foils. In this context, the type of application depends to a considerable extent on the desired layer thickness of the photosensitive layer, the preferred layer thicknesses of the dried layer being between 0.5 and 200 μm.

After adequate drying, the materials can be converted to their respective application form, in a known manner, by imagewise exposure using a negative film original or, with suitable sensitization, using a laser beam and subsequent development.

In this connection, the development is preferably carried out with aqueous-alkaline developer solutions having a pH value in the range between about 8 and 13. Optionally, the developers can contain additives that contribute to an accelerated, technically appropriate development operation. Particularly suitable additives for this purpose include surfactants and small quantities of a low-volatility organic solvent, such as benzyl alcohol. The composition of suitable developer solutions for the photosensitive layers according to the present invention is primarily dependent on the particular application; however, they should contain, as a rule, more than 75% by weight of water and less than 5% by weight of an organic solvent. Suitable developer solutions are known, for example, from German Offenlegungsschriften Nos. 2,809,774, 3,100,259 and 3,140,186.

The mixtures according to the present invention make it possible to produce very high-run lithographic printing plates. These exhibit a favorable ink receptivity while retaining favorable copying properties. For this field of application, reaction products of polyvinylacetals and phosphinic acid isocyanates of formula I, are particularly suitable as unsaturated polymers. The lithographic printing plates obtained from photosensitive mixtures containing these polymers exhibit, in addition, a capability for easy, scum-free development with aqueous-alkaline developer solutions, and a very favorable storage stability.

Moreover, photoresist stencils with excellent resolution can be obtained with the mixtures according to the present invention. For this application, reaction products of copolymers of hydroxyalkyl(meth)acrylate with phosphinic acid isocyanates of formula I are preferred unsaturated polymers.

The examples below are intended to explain the present invention and its possible applications in more detail. Parts by weight and parts by volume are in the ratio of $g/cm^3$; percentages and quantitative ratios are to be understood in parts by weight, unless otherwise specified.

EXAMPLE 1

100 g (0.8 mol) of methylvinylphosphinic acid chloride were dissolved in 100 ml of acetonitrile. 52.2 g (0.8 mol) of sodium cyanate were added thereto in small amounts, with vigorous stirring. The temperature was kept at a maximum of approximately 40° C. by cooling. The precipitate was filtered off by suction after stirring for 24 hours and washed with acetonitrile. The filtrate was concentrated in vacuo. The residue thus produced was distilled at a temperature of 58°–60° C. and a pressure of 52.6 Pa. 88 g of methylvinylphosphinic acid isocyanate (83.5% of theory) were obtained.

$C_4H_6NO_2P$ (131)

Calculated: 36.6% C, 4.6% H, 10.7% N, 23.7% P
Found: 35.9% C, 4.6% H, 10.3% N, 24.0% P 20 parts by weight of a polyvinylbutyral with a molecular weight of about 80,000, containing 71% by weight of vinylbutyral, 2% by weight of vinyl-acetate and 27% by weight of vinyl-alcohol units, were dissolved in 350 parts by weight of tetrahydrofuran. To this solution were added dropwise, at room temperature, 12 parts by weight of methylvinylphosphinic acid isocyanate in 50 parts by weight of tetrahydrofuran. The mixture was stirred for 4 hours, mixed with 50 parts by weight of ethanol and then added dropwise to 5,000 parts by weight of vigorously stirred distilled water. A fibrous amorphous product was produced which was filtered off by suction and dried. 27 parts by weight of a white polymer was obtained which had an acid number of 75 and a composition of C: 53.8%, H: 8.3%, N: 3.2% and P: 6.6%.

A coating solution was prepared that comprised 3.2 parts by weight of the reaction product described above,
0.32 part by weight of victoria pure blue FGA (C.I. Basic Blue 81) and
0.32 part by weight of 2-(4'-methoxystyryl)-4,6-bis-trichloromethyl-s-triazine in
150.0 parts by weight of ethylene glycol monomethyl ether.

The filtered solution was applied to a 0.3 mm-thick aluminum foil, which had been roughened up by brushing with an aqueous grinding-agent suspension and then pretreated with a 0.1% aqueous solution of polyvinylphosphonic acid, and then dried.

The copying layer thus obtained, which had a dry layer weight of 0.76 g/m², was exposed for 35 seconds, by the use of a negative original, with a metal halide lamp having a power of 5 kW. The exposed layer, which exhibited a clear differentiation between the exposed and unexposed layer regions, was treated with a developer solution of the following composition:

1 part by weight of trisodium phosphate dodecahydrate and
1 part by weight of sodium octylsulfate in
98 parts by weight of distilled water by means of a plush tampon, the nonexposed layer regions being removed within 15 seconds after being wetted by the developer liquid. Rinsing was then carried out with water, followed by drying.

In the resulting copy, step 4 of a silver-film continuous-tone step wedge, with a density range from 0.05 to 3.05 and density increments of 0.15, was fully imaged. Even ultrafine rasters and lines in the original were clearly reproduced.

The printing plate thus treated was blackened with protective ink, which was immediately taken up by the image areas.

EXAMPLE 2

106 g (0.57 mol) of phenylvinylphosphinic acid chloride were dissolved in 150 ml of acetonitrile and stirred with 38 g (0.59 mol) of sodium cyanate at a temperature of 30° C. After 23 hours the precipitate was filtered off by suction and washed with acetonitrile. The filtrate was concentrated and the residue distilled at a temperature of 107°–110° C. and a pressure of 33 Pa. 84 g of phenylvinylphosphinic acid isocyanate (77% of theory) were obtained.

$C_9H_8NO_2P$ (193)

Calculated: 56.0% C, 4.2% H, 7.3% N, 16.0% P
Found: 54.9% C, 4.0% H, 7.1% N, 16.0% P 20 parts by weight of the polyvinylbutyral described in Example 1 were reacted with 14 parts by weight of phenylvinylphosphinic acid isocyanate, likewise as specified in Example 1. A colorless product was obtained with an acid number of 58 and a composition of C: 59.8%, H: 9.4%, N: 1.8% and P: 4.3%.

A coating solution was prepared from 3.2 parts by weight of the reaction product described above,
0.32 part by weight of victoria pure blue FGA (C.I. Basic Blue 81) and
0.32 part by weight of 2-(4'-styrylpheny)-4,6-bis-trichloromethyl-s-triazine in
150 parts by weight of ethylene glycol monomethyl ether and applied to an aluminum foil which had been electrochemically roughened up in nitric acid, then anodized and treated with polyvinylphosphonic acid. The coating solution was dried to a layer weight of 0.8 g/m².

The exposure and development procedure was similar to that specified in Example 1. In this case, too, a covered step 4 was obtained in the continuous-tone step wedge described above.

The lithographic printing plate obtained was clamped in a sheet-fed offset machine and a run of up to 140,000 printed. After the printing trial had been discontinued, it was found that the plate used was still in satisfactory condition.

EXAMPLE 3

100 g (0.8 mol) of methylvinylphosphinic acid chloride were dissolved in 160 ml of acetonitrile. 61 g (0.8 mol) of ammonium thiocyanate were added thereto in small amounts, with vigorous stirring. The temperature was kept at a maximum of 30° C. by cooling slightly. After 3 days of stirring, the precipitate was filtered off by suction and post-washed with acetonitrile. The filtrate was concentrated in vacuo. The residue thus produced was distilled at a temperature of 70° C. and a pressure of 6.7 Pa. 65 g of methylvinylphosphinic acid isothiocyanate (55.1% of theory) were obtained.

$C_4H_6NOPS$ (147)

Calculated: 32.6% C, 4.1% H, 9.5% N, 21.2% P, 21.8% S
Found: 32.4% C, 4.1% H, 9.3% N, 21.2% P, 21.9% S 20 parts by weight of the polyvinylbutyral described in Example 1 were dissolved in 350 parts by weight of tetrahydrofuran. 0.2 parts by weight of diazabicyclo(2.2.2)-octane were added to the clear solution. Then 12 parts by weight of methylvinylphosphinic acid isothiocyanate in 50 parts by weight of tetrahydrofuran were added dropwise and, in this process no increase in temperature occurred. The mixture was brought to reflux temperature and left for 5 hours at this temperature. During this time the clear solution became yellow in color. After cooling, the solution was added dropwise to 5,000 parts by weight of water and the yellow fibrous product was filtered off by suction. It had a composition of C: 57.8%, H: 9.0%, N: 1.4%, P: 3.7% and S: 3.4%.

A coating solution was prepared from 3.2 parts by weight of the reaction product described above, 0.1 part by weight of crystal violet (C.I. 42555), 0.1 part by weight of phenylazodiphenylamine and 0.25 part by weight of 2-(4'-ethoxynaphth-1-yl)-4,6-bis-trichloromethyl-s-triazine in 150 parts by weight of ethylene glycol monomethyl ether.

The coating solution was applied to an aluminum plate as in Example 2. The dry layer weight was 0.78 g/m$^2$.

The exposed layer was treated with a developer of the composition 5 parts by weight of sodium lauryl sulfate and 3 parts by weight of sodium metasilicate pentahydrate in 92 parts by weight of distilled water as in Example 1.

Testing of the lithographic printing plate in a sheet-fed offset machine produced many thousands of satisfactory impressions.

EXAMPLE 4

20 parts by weight of a polyvinylbutyral with a molecular weight of over 80,000, which contained 77% to 80% by weight of vinylbutyral, 2% by weight of vinylacetate and 18% to 21% by weight of vinyl-alcohol units, were reacted, as in Example 1, with 16 parts by weight of methylvinylthiophosphinic acid isocyanate in tetrahydrofuran. The product thus obtained was faintly yellowish in color and had a phosphorus content of 6.7% and a sulfur component of 6.1%.

As in the previous example, a coating solution was prepared in which 2-(4'-trichloromethylbenzoylmethylene)-3-ethylbenzothiazoline was used as a photoinitiator.

After filtration the solution was applied to an electrochemically roughened-up aluminum foil which had been anodized and post treated with polyvinylphosphonic acid, and dried to a layer weight of 1.05 g/m$^2$. The foil was then exposed for 50 seconds through an original and treated with a developer of the following composition:

3.0 parts by weight of sodium octyl sulfate, 2.0 parts by weight of potassium oxalate, 4.0 parts by weight of disodium hydrogenphosphate hdodecahydrate, 1.5 parts by weight of trisodium phosphate dodecahydrate and 0.2 part by weight of sodium metasilicate nonahydrate in 89.3 parts by weight of distilled water.

It was possible to remove the unexposed layer regions easily and without scumming by means of a plush tampon soaked in developer solution. The original was faultlessly reproduced.

The printing plate was clamped in a sheet-fed offset machine and supplied more than 150,000 good impressions.

EXAMPLE 5

200 g (1.23 mol) of ethyl crotylmethylphosphinate were dissolved in 150 ml of dichloromethane, and phosgene was fed in while cooling at a temperature of 12°–15° C. and stirring for 3.5 hours. Stirring was continued for a further hour at 25° C., followed by distillation. 182 g of crotylmethylphosphinic acid chloride (97% of theory), with a boiling point of 83°–85° C. (260 Pa), were obtained.

$C_5H_{10}ClOP$ (153)

Calculated: 39.4% C, 6.6% H, 20.3% P

Found: 39.9% C, 6.5% H, 20.1% P 170 g (1.1 mol) of crotylmethylphosphinic acid chloride were dissolved in 300 ml of acetonitrile and heated with 73 g (1.1 mol) of sodium cyanate to 55° C. while stirring. After 4.5 hours, the precipitate was filtered off by suction and washed with acetonitrile, the filtrate was concentrated, and the residue distilled at a temperature of 76°–78° C. and at a pressure of 27 Pa. 123 g of crotylmethylphosphinic acid isocyanate (70% of theory) were obtained.

$C_6H_{10}NO_2P$ (159)

Calculated: 45.3% C, 6.3% H, 8.8% N, 19.5% P

Found: 45.0% C, 6.2% H, 8.6% N, 19.4% P 11.3 parts by weight of the polyvinylbutyral described in Example 1 were dissolved in 160 parts by weight of tetrahydrofuran. 7.2 parts by weight of crotylmethylphosphinic acid isocyanate in 25 parts by weight of tetrahydrofuran were added dropwise to the clear solution and left for 4 hours at room temperature. The product subsequently precipitated in water and isolated had an acid number of 87.

A coating solution was prepared from 48.5 parts by weight of the reaction product described above, 24.1 parts by weight of a diazonium salt polycondensation product prepared from 1 mol of 3-methoxydiphenylamine-4-diazonium sulfate and 1 mol of 4,4'-bis(methoxymethyl)diphenyl ether in 85% phosphoric acid and isolated as mesitylenesulfonate, 2.4 parts by weight of phosphoric acid (85%), 1.8 parts by weight of victoria pure blue FGA (C.I. Basic Blue 81) and 0.9 part by weight of phenylazodiphenylamine in 1,700.0 parts by weight of ethylene glycol monomethyl ether and 518.0 parts by weight of tetrahydrofuran.

The filtered solution was applied to an aluminum foil which had been pretreated as in Example 2, and the solution was then dried to a dry weight of 1.0 g/m$^2$.

The copying layer was exposed for 35 seconds under a negative original. A solution consisting of 5.0 parts by weight of sodium lauryl sulfate, 1.5 parts by weight of sodium metasilicate pentahydrate and 1.0 part by weight of trisodium phosphate dodecahydrate in 92.5 parts by weight of demineralized water was used for development. In the copy obtained, stage 5 of the continuous-tone step wedge was still fully imaged.

After the printing plate had been clamped in a sheet-fed offset machine, more than 130,000 qualitatively satisfactory impressions were obtained.

EXAMPLE 6

To the coating solution of Example 5 were added 2.6 parts by weight of 2-(4'-styrylphenyl)-4,6-bis-trichloromethyl-s-triazine. For the same layer weight, the photosensitivity of the copy produced using the resulting solution corresponded to that of the previous example. In a printing trial conducted as described above, a run of more than 170,000 qualitatively good impressions was obtained.

EXAMPLE 7

A coating solution was prepared from
27.2 parts by weight of an 8.4% solution of the reaction product described in Example 1 in tetrahydrofuran,
0.5 part by weight of the diazonium salt polycondensation product described in Example 5,
0.1 part by weight of phosphoric acid (85%),
0.03 part by weight of phenylazodiphenylamine,
0.06 part by weight of 2-(4'-methoxystyryl)-4,6-bistrichloromethyl-s-triazine and
0.03 part by weight of a blue azo dyestuff obtained by coupling 2,4-dinitro-6-chlorobenzene-diazonium salt to 2-methoxy-5-acetylamino-N-cyanoethyl-N-hydroxyethylaniline in
150.0 parts by weight of ethylene glycol monomethyl ether.

The filtered solution was applied to an aluminum foil, which had been electrolytically roughened up in hydrochloric acid, then anodized and post-treated, and the solution then dried to a layer weight of 1.1 g/m².

The layer thus prepared was exposed through a negative original for 35 seconds, a covered step 5 being obtained. The development was carried out as described in Example 5. After the printing plate had been clamped in a sheet-fed offset machine, it was possible to observe that the printing plate took up the ink presented very rapidly, so that only a small amount of waste paper was produced. The printing trial was discontinued after 150,000 impressions, the lithographic printing plate used not exhibiting any abrasion effects.

EXAMPLE 8

The solutions described in Examples 5 and 6 were each applied to five aluminum plates which had been electrochemically roughened up, anodized and treated with polyvinylphosphonic acid. The 10 samples in each case had a layer weight of between 1.03 and 1.11 g/m². The plates obtained were stored in pairs (a sample as in Example 5 and 6 in each case) in a drying oven heated to 100° C. for one hour or two to five hours. After cooling down, the plates were exposed for 35 seconds under a test original and processed with the developer from Example 5.

The printing plates made as in both Examples, when stored for one or two hours, showed no change compared with a copy processed normally. The layer of Example 5 likewise largely corresponded to the reference copy after being stored for three hours, while the layer of Example 6 could be developed with a slight delay and showed an extension of the continuous-tone step wedge by about 2 steps. This effect was exhibited also by the layer of Example 5 stored for 4 hours, while the corresponding layer of Example 6 could be developed only with the formation of flakes. When clamped in the printing machine, the latter layer also showed a tendency to take up ink at the non-image areas. This applied also, but to a markedly greater extent, to the plates stored for five hours.

All in all, it was possible to deduce from the present example that the quite good storage stability of the layer of Example 5 was surprisingly little influenced by the addition of a photoinitiator (Example 6).

EXAMPLE 9

A terpolymer which comprised 50% by weight of hydroxyethyl methacrylate, 20% by weight of methyl methacrylate and 30% by weight of hexyl methacrylate was mixed with an excess of methylvinylphosphinic acid isocyanate (for preparation, see Example 1) such that all the hydroxyl groups were converted into unsaturated phosphinylurethane groups. The polymer obtained had a mean molecular weight of about 32,000.

A solution was prepared from
6.5 parts by weight of the reaction product described above,
5.6 parts by weight of an industrial mixture of pentaerythritol tri- and tetramethacrylate,
0.3 part by weight of 2-(4'-methoxystyryl)-4,6-bis-trichloromethyl-s-triazine and
0.03 part by weight of the azo dyestuff described in Example 7 in
25.0 parts by weight of butanone,
2.0 parts by weight of ethanol and
1.0 parts by weight of butylacetate,
which solution was spun into a biaxially stretched and thermally fixed, 25 µm-thick polyethylene terephthalate film. A layer weight of 35 g/m² was obtained after drying at 100° C.

The dry resist film produced in this way was laminated with a laminator at 120° C. onto a phenoplast-laminated plate that was clad with 35 µm-thick copper foil. The resist was then exposed for about 25 seconds under a commercial exposure unit. A line original with line widths and spacings of down to 80 µm was used as the original.

After exposure, the polyester film was pulled off and the layer obtained was developed for 90 seconds in a developer solution with a composition of
3.0 parts by weight sodium metasilicate nonahydrate and
0.04 part by weight of noniogenic wetting material (coconut fat alcohol polyoxyethylene ether containing approximately 8 oxyethylene units) in
96.96 parts by weight of demineralized water
in a spray development unit. The plate was then rinsed for 30 seconds with tap water, slightly etched for 30 seconds with a 15% ammonium peroxydisulfate solution, and finally electroplated in the following electrolytic baths:
(1) For 30 minutes in a copper electrolyte made by Schloetter, Geislingen/Steige, "Glanzkupferbad" type,
current density: 2.5 A/dm²,
metal buildup: about 15 µm.
(2) 10 minutes in a nickel bath made by Schloetter, Geislingen/Steige, "Norma" type,
current density: 4 A/dm²,
metal buildup: 9 µm.

The plate showed no damage or undercutting. The stripping was carried out with 5% KOH solution at 50° C. The exposed copper was etched away with the usual etching media.

EXAMPLE 10

140 g (0.86 mol) of ethyl β-methallylmethylphosphinate were dissolved in 120 ml of dichloromethane, and phosgene was fed in at a temperature of 15°–20° C. for 3 hours. Stirring was continued for an additional 2 hours at 25° C., and distillation was then carried out. 127 g of β-methallylmethylphosphinic acid chloride (97% of theory), with a boiling point of 66°–68° C. (27 Pa), were obtained.

$C_5H_{10}ClOP$ (153)
Calculated: 39.4% C, 6.6% H, 20.3% P
Found: 39.8% C, 6.8% H, 20.6% P 127 g (0.83 mol) of β-methallylmethylphosphinic acid chloride were dissolved in 200 ml of acetonitrile and heated, with stirring at 50°–55° C., together with 54 g (0.83 mol) of sodium cyanate. After 5 hours, the precipitate was filtered off by suction and washed with acetonitrile, and the filtrate was concentrated and distilled at a temperature of 70°–75° C. and at a pressure of 13 Pa. 115 g of β-methallylmethylphosphinic acid isocyanate (87% of theory) were obtained.

$C_6H_{10}NO_2P$ (159)
Calculated: 45.3% C, 6.3% H, 8.8% N, 19.5% P
Found: 45.2% C, 6.4% H, 8.6% N, 18.9% P 20 parts by weight of an epoxy resin (Epikote 1007, made by Shell) were dissolved in 300 parts by weight of tetrahydrofuran. 12 parts by weight of β-methallylmethylphosphinic acid isocyanate in 30 parts by weight of tetrahydrofuran were added dropwise to the clear solution and left for 4 hours at room temperature.

A coating solution consisting of
22.6 parts by weight of an 8.84% solution of the reaction product described above in tetrahydrofuran,
1.5 parts by weight of trimethylolpropane trimethacrylate,
0.8 part by weight of an industrial mixture of pentaerythritol tri- and tetraacrylate,
0.2 parts by weight of 2-(4'-trichloromethylbenzoylmethylene)-3-ethylbenzothiazolin and
0.01 part by weight of p-methoxyphenol in
60.0 parts by weight of ethylene glycol monomethyl ether
was applied to an aluminum foil which had been electrochemically roughened up, anodized and post-treated, to a thickness of 3.2 μm. The dried layer was coated with polyvinyl alcohol (about 1 g/m²) and imagewise exposed under a negative original.

An excellently resolving printing plate was obtained, which plate achieved a very high run in a sheet-fed offset machine.

EXAMPLE 11

A coating solution was prepared from
20.0 parts by weight of the reaction product described in Example 2 of a polyvinylacetal and phenylvinylphosphinic acid isocyanate (for preparation, see Example 2),
18.0 parts by weight of 2.6-bis(4'-azidobenzal)cyclohexanone,
2.5 parts by weight of rhodamine 6 GDN extra (C.I. 45160) and
1.9 parts by weight of 2-(4'-styrylphenyl)-4,6-bistrichloromethyl-s-triazine in
900.0 parts by weight of ethylene glycol monomethyl ether and
450.0 parts by weight of tetrahydrofuran.

This solution was applied to an aluminum plate to a dry layer weight of 0.9 g/m², as in Example 2.

After exposure under a negative original, development was carried out in a developer with the composition of
5 parts by weight of triethanolammonium lauryl sulfate,
1 part by weight of sodium metasilicate pentahydrate and
1 part by weight of trisodium phosphate dodecahydrate, in
93 parts by weight of water,
followed by preservation.

With the printing plate obtained in this manner, a run of more than 170,000 qualitatively perfect impressions was achieved on a sheet-fed offset machine.

EXAMPLE 12

A coating solution was prepared from
53.5 parts by weight of the polymeric reaction product described in Example 10 as an 8.8% solution in tetrahydrofuran,
4.4 parts by weight of 4,4'-diazostilbene-3,3'-disulfonic acid,
0.4 part by weight of rhodamine 6 GDN extra,
0.3 part by weight of 2-benzoylmethylene-1-methyl-β-naphthothiazoline and
0.2 part by weight of 2-ethylanthraquinone in
200 parts by weight of ethylene glycol monomethyl ether and
80 parts by weight of an industrial mixture of butanol/butyl acetate (15:85).

The solution was applied to the support described in Example 2 to give a dry layer weight of 0.8 g/m².

The copying layer was exposed for 35 seconds under a negative original, a positive dark-red image being produced. The layer was processed with the developer solution from Example 3. In the resulting copy, step 5 was fully covered.

A run of 130,000 sheets was obtained, as described above, the lithographic printing plate taking up ink immediately on the image areas, even after prolonged standing.

EXAMPLE 13

A coating solution was prepared from
3.0 parts by weight of the polymeric reaction product described in Example 1,
1.0 part by weight of the diazonium salt condensation product described in Example 5,
0.2 part by weight of Victoria pure blue FGA,
0.3 part by weight of an industrial mixture of pentaerythritol tri- and tetraacrylate,
0.3 part by weight of 2-(4'-methoxystyryl)-4,6-bis-trichloromethyl-s-triazine and
0.1 part by weight of phosphoric acid (85%) in
100 parts by weight of ethylene glycol monomethyl ether and
80 parts by weight of tetrahydrofuran
and applied to an aluminum foil treated as in Example 2. The dry layer weight was 1.6 g/m².

The copying layer thus obtained was exposed for 30 seconds under a negative original, a covered stage 5 of the half-tone step wedge being obtained.

A mixture consisting of
0.2 part by weight of sodium metasilicate nonahydrate,
3.9 parts by weight of disodium hydrogenphosphate dodecahydrate, 3.5 parts by weight of trisodium phosphate dodecahydrate,
1.5 parts by weight of potassium tetraborate tetrahydrate and
2.9 parts by weight of sodium octyl sulfate in
88.0 parts by weight of demineralized water
was used as developer.

Far more than 250,000 impressions were achieved with the developed printing plate in a sheet-fed offset machine.

EXAMPLES 14–17

As in Example 1, 20 parts by weight of the polyvinylbutyral described there were reacted in each case with 8 parts by weight of the phosphinic acid isocyanates below:

Example 14: Methylvinylphosphinic acid isocyanate (for preparation see Example 1) acid number: 54; analysis: C: 55.8%, H: 8.3%, N: 1.9%, P: 3.9%.

Example 15: Allylmethylphosphinic acid isocyanate acid number: 46; analysis: C: 58.3%, H: 9.1%, N: 1.6%, P: 3.6%.

Example 16: Crotylmethylphosphinic acid isocyanate (for preparation see Example 5) acid number: 50; analysis: C: 58.1%, H: 8.5%, N: 2.0%, P: 3.8%.

Example 17: β-methallylmethylphosphinic acid isocyanate (for preparation see Example 10) acid number: 42; analysis: C: 57.7%, H: 9.0%, N: 1.5%, P: 3.7%.

Preparation of allylmethylphosphinic acid isocyanate: 166 g (1.2 mol) of allylmethylphosphinic acid chloride were dissolved in 300 ml of acetonitrile and heated with 78 g (1.2 mol) of sodium cyanate to 50°–55° C. while stirring. After 5.5 hours, the precipitate was filtered off by suction and washed with acetonitrile. The filtrate was then concentrated and the residue distilled at a temperature of 78°–80° C. and at a pressure of 25 Pa. 123 g of allylmethylphosphinic acid isocyanate (71% of theory) were obtained.

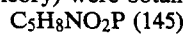
$C_5H_8NO_2P$ (145)

Calculated: 41.4% C, 5.6% H, 9.7% N, 21.4% P
Found: 41.6% C, 5.7% H, 9.5% N, 21.0% P As in Example 1, coating solutions were prepared from these polymers and applied to an aluminum foil which had been electrochemically roughened up, anodized and pretreated with polyvinylphosphonic acid. The coatings were each dried to a mean dry layer weight of approximately 0.8 g/m².

After the exposure, the nonimage areas were removed with the developer composition specified in Example 1.

In order to achieve a practical differentiation between image and nonimage areas, the layer of Example 14 had to be exposed for 24 seconds, that of Example 15 for 35 seconds and that of Examples 16 and 17 for 50 seconds.

EXAMPLE 18

After cleaning the copper surface with an abrasive and then rinsing with acetone, a plastic-material board clad with thin copper foil was coated with a solution of the following composition:

13.0 parts by weight of the polymeric reaction product described in Example 1,
11.0 parts by weight of 4,4'-bis(β-acryloyloxyethoxy)-diphenyl ether,
0.4 part by weight of 2-(4'-methoxystyryl)-4,6-bis-trichloromethyl-s-triazine and
0.1 part by weight of crystal violet in
150 parts by weight of butanone,
40 parts by weight of ethanol and
76 parts by weight of butyl acetate.

A layer weight (dry) of 3 g/m² was established. Exposure was carried out through a negative which represented a circuit pattern, and development was carried out as in Example 9.

A printed circuit was obtained by etching away the copper in the exposed areas with 40% aqueous iron(III) chloride solution.

EXAMPLES 19 and 20

Two coating solutions were prepared, as in Example 1, by the use of the polymers of Examples 14 and 16, respectively, and applied to an electrochemically pretreated aluminum foil. The layer weight was in both cases about 1 g/m².

After exposure and development, the copies obtained were preserved and heated for 5 minutes at 200° C. Both printing plates achieved high runs of qualitatively perfect impressions in the sheet-fed offset machine.

EXAMPLE 21

140 g (0.86 mol) of ethyl β-methallylmethylphosphinate were dissolved in 120 ml of dichloromethane and phosgene was fed in for 3 hours at a temperature of 15°–20° C. Stirring was continued for a further 2 hours at 25° C., followed by distillation. 127 g of β-methallylmethylphosphinic acid chloride (97% of theory) with a boiling point of 66°–68° C. (27 Pa), were obtained.

$C_5H_{10}ClOP$ (153)

Calculated: 39.4% C, 6.6% H, 20.3% P
Found: 39.8% C, 6.8% H, 20.6% P 83 g (0.55 mol) of β-methallylmethylphosphinic acid chloride were mixed, with slight cooling, in 200 ml of acetonitrile with 42 g (0.55 mol) of ammonium thiocyanate; the mixture was then stirred at a temperature of about 30° C. After 3 days the precipitate was filtered off by suction and was washed with acetonitrile. The filtrate was then concentrated and distilled. 72 g of β-methallylmethylphosphinic acid isothiocyanate (75% of theory) with a boiling point of 98°–100° C. (66 Pa), were obtained.

$C_6H_{10}NOPS$ (175)

Calculated: 41.1% C, 5.8% H, 8.0% N, 17.7% P, 18.3% S
Found: 41.0% C, 5.6% H, 8.6% N, 17.4% P, 18.0% S 20 parts by weight of the polyvinylbutyral described in Example 1 were dissolved in 300 parts by weight of tetrahydrofuran and mixed with 0.2 parts by weight of diazabicyclo(2.2.2)octane. 16 parts by weight of β-methallylmethylphosphinic acid isothiocyanate in 50 parts by weight of tetrahydrofuran were added dropwise, and the resulting mixture was kept under reflux for 6 hours. The yellow solution thus obtained was added dropwise to 6,000 parts by weight of water, yielding 34 parts by weight of a yellow fibrous polymer which contained 7.2% of phosphorus and 6.1% of sulfur.

A coating solution was prepared from
25 parts by weight of the reaction product described above,
25 parts by weight of the diazonium salt polycondensate described in Example 5,
2.5 parts by weight of phosphoric acid (85%),
2.0 parts by weight of Victoria pure blue FGA and
0.8 part by weight of phenylazodiphenylamine in 1600 parts by weight of ethylene glycol monomethyl ether.

Pursuant to the above-described procedures and after exposure through a negative original, a clearly differentiated image of the original was obtained with the developer used in Example 13. In the printing machine, the ink was taken up even during the first 6 impressions, when a printing plate prepared with the coating solution was employed. A run performance of markedly more than 100,000 impressions was achieved.

EXAMPLE 22

20 parts by weight of a polyamide (Ultramid 1C ®, BASF) were swelled for about 12 hours in 200 parts by weight of phosphoric acid trisdimethlyamide, and then were dissolved over the course of 4 hours with vigorous stirring. 15 parts by weight of phenylvinylphosphinic acid isocyanate (for preparation, see Example 2) were then added dropwise to the clear solution at 30° C. Stirring of the mixture was continued for 6 hours and then precipitation was carried out in a mixture of 10% ethanol and 90% water. The precipitate was filtered, washed and dried.

A coating solution was prepared from
8.0 parts by weight of the reaction product described above,
7.5 parts by weight of an industrial mixture of pentaerythritol tri- and tetraacrylate,
0.5 part by weight of 2-(4'-methoxystyryl)-4,6-bis-trichloromethyl-s-triazine,
1.3 parts by weight of a copper phthalocyanin pigment and
0.1 part by weight of 4-methoxyphenol in
200.0 parts by weight of ethylene glycol monomethyl ether and
150.0 parts by weight of dimethylformamide.

The coating was carried out as described in Example 10. After exposure and development with a developer mixture consisting of
4 parts by weight of benzyl alcohol,
3 parts by weight of sodium lauryl sulfate,
3 parts by weight of trisodium phosphate and
1 part by weight of sodium hydroxide in
89 parts by weight of water
a technically appropriate printing plate was obtained with which a very high run performance was achieved.

What is claimed is:

1. A photosensitive mixture comprising (a) a photosensitive compound, selected from the group consisting of photoinitiators and negative-working photosensitive substances, and present in sufficient amount to render said mixture sensitive to light, and (b) a polymeric compound having lateral olefinically unsaturated radicals, wherein said polymeric compound is present in an amount sufficient to affect alkali solubility of said photosensitive mixture, and is a product of reacting (i) an olefinically unsaturated compound represented by the formula

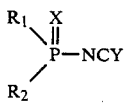

wherein
X and Y are the same or different and each is oxygen or sulfur,
$R_1$ is an olefinically unsaturated aliphatic radical containing 2 to 8 carbon atoms and
$R_2$ is a saturated aliphatic radical containing 1 to 8 carbon atoms or an aryl radical containing 6 to 10 carbon atoms,
with (ii) a polymer containing active hydrogen, wherein said polymer contains hydroxyl or amino groups, and the active hydrogen is supplied by hydroxyl or amino groups.

2. A photosensitive mixture as claimed in claim 1, wherein $R_1$ is an olefinically unsaturated aliphatic radical containing 2 to 4 carbon atoms.

3. A photosensitive mixture as claimed in claim 1, wherein $R_2$ is a saturated aliphatic radical containing 1 to 2 carbon atoms or a phenyl radical.

4. A photosensitive mixture as claimed in claim 1, wherein $R_1$ is a vinyl group and X and Y are oxygen atoms.

5. A photosensitive mixture as claimed in claim 1, wherein the polymer containing hydroxyl or amino groups is a polymer containing vinyl alcohol, allyl alcohol, hydroxyalkyl acrylate or hydroxyalkyl methacrylate units, an epoxy resin, cellulose ether, cellulose ester or polyester containing free hydroxyl groups, a polyamine, a polyamide or a polyurethane.

6. A photosensitive mixture as claimed in claim 1, wherein the photosensitive compound is a photoinitiator for the polymerization or crosslinking of said olefinically unsaturated radicals.

7. A photosensitive mixture as claimed in claim 1, wherein the photosensitive compound is a compound which crosslinks on exposure.

8. A photosensitive mixture as claimed in claim 7, wherein the compound which crosslinks on exposure is a diazonium salt, a p-quinone diazide or an organic azido compound.

9. A photosensitive mixture as claimed in claim 6, further comprising a low-molecular polymerizable compound that contains at least one olefinic double bond.

10. A photosensitive mixture as claimed in claim 1, further comprising a polymerization initiator that is inactive at room temperature and that is active at an elevated temperature.

11. A photosensitive recording material comprising a layer support and a photosensitive layer, wherein said photosensitive layer contains (a) a photosensitive compound, selected from the group consisting of photoinitiators and negative-working photosensitive substances, and present in sufficient amount to render said layer sensitive to light, and (b) a polymeric compound with lateral olefinically unsaturated radicals, wherein said polymeric compound is present in an amount sufficient to affect alkali solubility of said photosensitive layer, and is a product of reacting (i) an olefinically unsaturated compound represented by the formula

wherein
X and Y are the same or different, and each is oxygen or sulfur,
$R_1$ is an olefinically unsaturated aliphatic radical containing 2 to 8 carbon atoms and
$R_2$ is a saturated aliphatic radical containing 1 to 8 carbon atoms or an aryl radical containing 6 to 10 carbon atoms,
with (ii) a polymer containing active hydrogen, wherein said polymer contains hydroxyl or amino groups and the active hydrogen is supplied by hydroxyl or amino groups.

* * * * *